United States Patent
Storino

(10) Patent No.: US 7,142,061 B2
(45) Date of Patent: Nov. 28, 2006

(54) BALANCED SINGLE ENDED TO DIFFERENTIAL SIGNAL CONVERTER

(75) Inventor: Salvatore N. Storino, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 11/038,706

(22) Filed: Jan. 20, 2005

(65) Prior Publication Data

US 2006/0158258 A1  Jul. 20, 2006

(51) Int. Cl.
*H03F 3/04* (2006.01)

(52) U.S. Cl. ...................................... 330/301; 330/253

(58) Field of Classification Search ................ 330/301, 330/253, 261, 252, 116, 117, 200
See application file for complete search history.

(56) References Cited

U.S. PATENT DOCUMENTS 6,614,302 B1 *  9/2003  Abe .......................... 330/253
6,628,168 B1 *  9/2003  Martin et al. ............... 330/253

* cited by examiner

*Primary Examiner*—Henry Choe
(74) *Attorney, Agent, or Firm*—Patterson & Sheridan LLP

(57) ABSTRACT

Techniques and circuits for generating a pair of differential signals with balanced switching between logical states from a single ended input signal are provided. The differential signals may be generated by controlling the switching of substantially identical driver stages with a set of control signals generated based on the single ended input signal.

20 Claims, 3 Drawing Sheets

BALANCED SINGLE ENDED TO DIFFERENTIAL SIGNAL CONVERTER

BACKGROUND OF THE INVENTION

1. Field of the Invention

The present invention generally relates to electronic circuits and, more particularly, to a circuit and technique for generating a pair of differential signals from a single ended signal.

2. Description of the Related Art

To meet the computing industry's growing demands for high speed data transfer between components, many systems forego conventional parallel buses to high speed synchronous serial buses. In such systems, data is transferred between devices on a serial bus, synchronized to a clock signal. For example, in a gaming system, such a serial bus may be used to transfer data between a central processing unit (CPU) and a graphics processing unit (GPU). A receiving component will typically transfer the serially received data to some component for de-serialization, converting the serial data into for presentation on wider internal buses for efficient processing. For example, data transferred over a high speed serial 8-bit bus may be processed internally using a 64-bit bus.

In some cases, in order to route data internally (e.g., for serialization or de-serialization) single ended signals may be converted to differential signal. By utilizing lower voltage swings than single ended signals, differential signals can generally provide higher data throughput. This is possible because the differential threshold in a differential receiver is typically more easily controlled than the threshold of a single transistor. The lower voltage swings can also result in reduced power consumption and reduced switching noise and crosstalk, as the opposite currents carried on differential signal traces tend to cancel the electric and magnetic fields.

FIG. 1 illustrates an exemplary conventional differential signal driver circuit 100 for generating a pair of differential signals OUTX and OUTY from a single ended input signal XIN. As illustrated, switching signals X1 and XB may be generated from the input signal XIN via a pair of inverters 112 and 114, respectively. These switching signals may be used to control the switching of transistors 102 and 104. A bias voltage VBIAS applied to a transistor 106 may be used to control the total current flowing through the switching transistors 102 and 104. Load resistors 108 may be sized accordingly to the impedance of the transmission line.

Operation of the driver circuit 100 may be explained with reference to the timing diagrams 200 and 210 shown in FIG. 2. Waveforms for signals X1 and XB are shown as waveforms 202 and 204, respectively. Waveforms for the differential output signals OUTX and OUTY are shown as waveforms 214 and 212, respectively The illustrated example assumes that the input signal XIN begins in an initial low state. Consequently, X1 is in a high state and XB is in a low state, causing transistor 102 to be turned on and transistor 104 to be turned off. As a result, node X is pulled down, keeping differential signal OUTX in a low initial state, while node Y is pulled up, keeping differential signal OUTY in a high initial state.

XIN then transitions to a high state, causing X1 to begin transitioning to a low state, at a time t0. Once X1 falls below a switching threshold of transistor 102, at time t1, transistor 102 will turn off and node X will begin charging, causing OUTX to transition to a high state. Due to the delay associated with the inverter 114, XB will not begin transitioning to a high state until a time t2 after X1 has begun transitioning. As a result, XB will not reach a switching threshold of transistor 104, until a later time t3, finally causing transistor 104 to turn on and node Y to begin discharging, bringing OUTY to a low state, which is finally reached at t4.

The differential signal pair OUTX and OUTY is typically routed to a receiver at some other location on a circuit board that converts the differential signal pair back to a single ended signal. Unfortunately, the delay D between switching of differential signals OUTX and OUTY, caused by the inverter delay between switching signals X1 and XB, can result in duty cycle distortion. In other words, the single ended signal generated by the receiver may have an asymmetrical duty cycle, for example, assuming an input signal pattern alternating between high and low states, with one logic state of the signal waveform being greater than the other. In some cases, the single ended signal generated by the receiver may be synchronized with a clock signal having a symmetrical (50%) duty cycle for high and low states. In such cases, the asymmetry of the logic states may result in reduced timing margins.

Accordingly, what is needed is a technique for generating a pair of differential signals with balanced switching between logical states.

SUMMARY OF THE INVENTION

The present invention generally circuits and methods for generating a pair of balanced differential signals from a single ended input signal.

One embodiment provides a differential driver circuit. The differential driver circuit generally includes a control signal generator for generating a set of control signals based on a single ended input signal, wherein, in response to a transition of the single ended input signal from a first state to a second state, the second signal begins to transition at a point in time between the beginnings of transitions of the first and third signal. The differential driver circuit also includes first and second stages responsive to the first, second, and third control signals to generate a pair of differential signals on common nodes, each coupled to both the first and second stages.

Another embodiment provides another differential driver circuit. The differential driver circuit generally includes a series of inverters for generating at least first, second, and third control signals based on a single ended input signal, wherein the first and third control signals are logically inverted relative to the single ended input signal. The differential driver circuit also includes a first stage comprising first and second transistors controlled by the first and second control signals, respectively, a second stage comprising first and second transistors controlled by the third and second control signals, respectively, a first output node electrically coupled to drains of the first transistors of the first and second stages for generating a first of a pair of differential signals, and a second output node electrically coupled to drains of the second transistors of the first and second stages for generating a second of the pair of differential signals.

Another embodiment provides a method of generating a pair of differential signals from a single ended input signal. The method generally includes generating at least first, second, and third control signals based on the single ended input signal, wherein, in response to a transition of the single ended input signal from a first state to a second state, the second signal begins to transition at a point in time between the beginnings of transitions of the first and third signal, and controlling the switching of first and second stages with the first, second, and third control signals to generate the pair of differential signals on common nodes, each coupled to both the first and second stages.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Embodiments of the present invention provide a technique and circuit for generating, from a single ended input signal, a pair of differential signals with balanced switching between logical states. As a result, the differential signals may be more symmetrical and, consequently, have reduced duty cycle distortion, when compared with differential signals generated by convention differential signal driver circuits.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

A BALANCED DIFFERENTIAL DRIVER CIRCUIT

Figure 3:
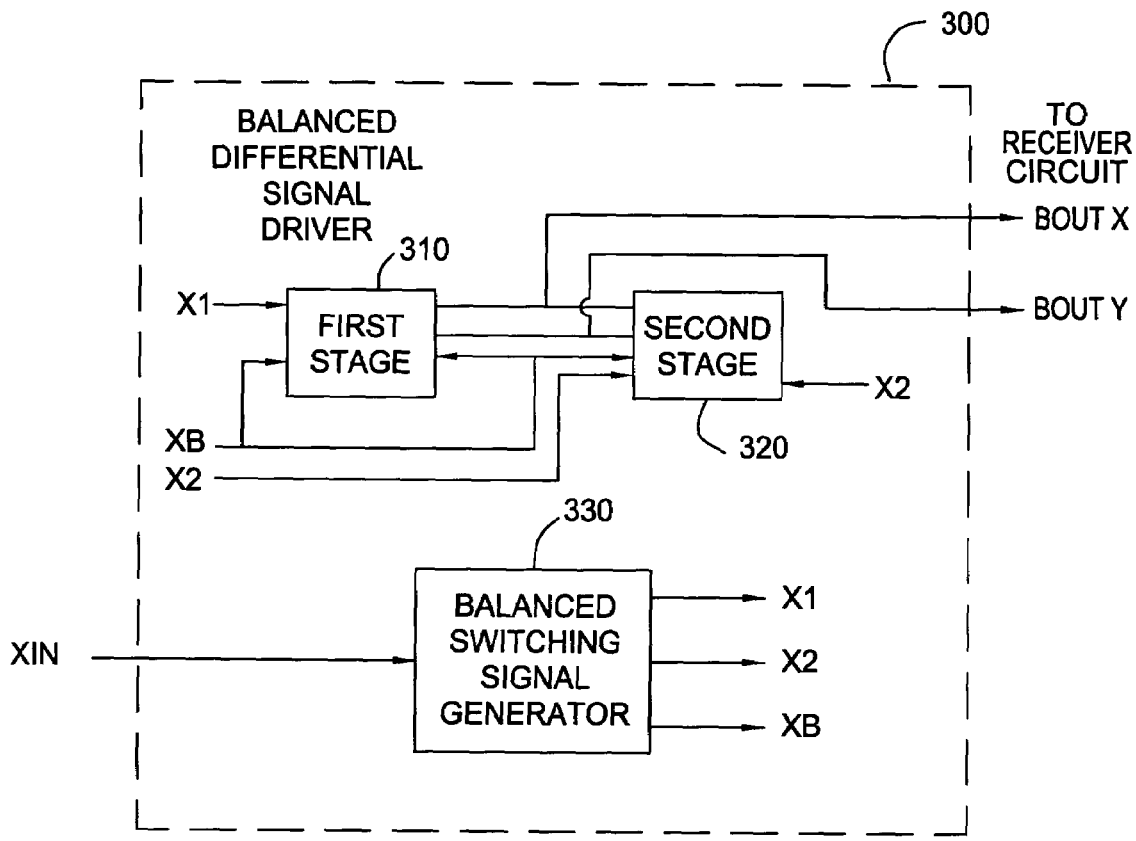
FIG. 3 illustrates a block diagram of an exemplary differential signal driver circuit in accordance with embodiments of the present invention.

FIG. 3 illustrates a block diagram of an exemplary differential signal driver circuit 300 in accordance with embodiments of the present invention for generating, from a single ended input signal XIN, a pair of balanced differential output signals BOUTX and BOUTY with symmetrical (balanced) switching characteristics.

As illustrated, the driver circuit 300 generally includes first and second stages 310 and 320 to generate BOUTX and BOUTY. A set of control signals X1, XB, and X2 may be used to control switching of the stages 310 and 320. As illustrated, X1 and XB may be used to control the switching of the first stage 310, while XB and X2 may be used to control the switching of the second stage 320.

A balanced switching signal generator 330 may be used to generate the switching control signals X1, XB, and X2 from the input signal X1. For some embodiments, the control signals X1, XB, and X2, may be evenly spaced in time, with a substantially equal delay between transitions of each control signal. For example, XB may transition a unit delay after X1, while X2 may transition a unit delay after XB. For some embodiments, X1 and X2 may be of the same polarity, while XB may be of opposite polarity (e.g., XB may be complementary with respect to X1 and X2).

In order to match the switching times of the differential signals BOUTX and BOUTY, The first and second stages 310 and 320 may consist of substantially identical parts such that they are electrically balanced. In other words, the components in each stage may be chosen and arranged such that switching characteristics of each stage is substantially identical. Further, the first and second stages may be coupled together to form a common node that effectively sums current generated by transitions of signals X1 and X2. As will be described in greater detail below, the result of this summing node is that the switching times of X1 and X2 may be effectively averaged to match the switching time of XB.

Figure 4:
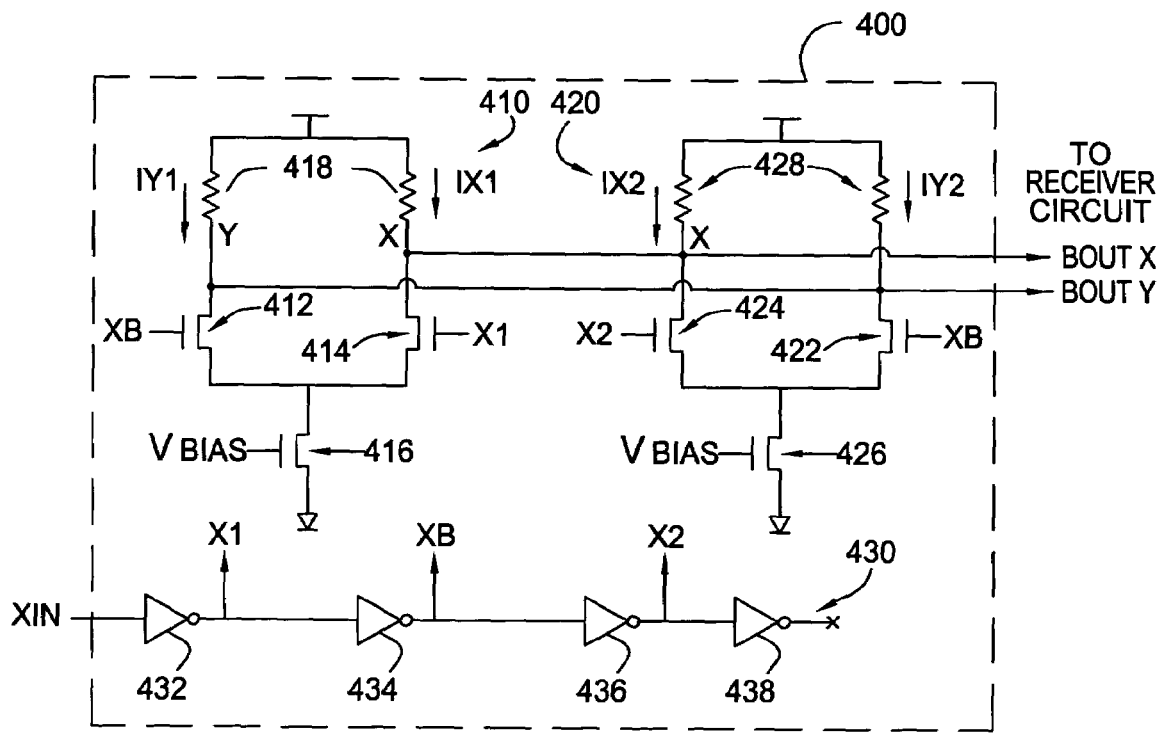
FIG. 4 illustrates a schematic diagram of an exemplary differential signal driver circuit in accordance with embodiments of the present invention.

FIG. 4 illustrates a schematic diagram of an exemplary differential signal driver circuit 400, in accordance with one embodiment of the present invention, having substantially identical first and second stages 410 and 420. In other words, the first stage 410 may correspond to a specific implementation of the first stage 310 shown in FIG. 3, while the second stage 420 may correspond to a specific implementation of the second stage 320. Those skilled in the art will recognize that, while not illustrated, various other components may also be included in the driver circuit 400, such as capacitors coupled across switching nodes in order to smooth out waveforms during transitions.

As illustrated, the first stage 410 may include switching transistors 412 and 414, load resistors 418 and a transistor 416 for controlling the amount of current flowing through the transistors 412 and 414 based on a bias voltage VBIAS. The second stage 420 may include switching transistors 422 and 424, load resistors 428 and a bias transistor 426, all substantially equivalent to those used in the first stage 410. Thus, the driver circuit 400 is scalable to match the impedance of different transmissions lines, by sizing the load resistors 428 accordingly. Load resistors 418 and 428 may be sized such that the parallel connection of a resistor 418 and a resistor 428 equal or approximate the transmission line impedances driven by nodes X and Y.

As illustrated, each stage may essentially be a mirror representation of the other stage, such that the switching characteristics of each are substantially identical. In other words, the stages 410 and 420 may be substantially symmetrical, with components used in the stage 410 may be substantially identical to corresponding components used in the stage 420. As illustrated, the first and second stage may be connected to form common nodes X and Y, on which the differential signals BOUTX and BOUTY are generated, respectively.

The first stage switching transistors 412 and 414 may be controlled by signals XB and X1, respectively, while the second stage switching transistors 422 and 424 may be controlled by signals XB and X2, respectively. For some embodiments, the control signals X1, XB, and X2 may be generated by an arrangement 430 of inverters 432, 434, and 436, respectively. In the illustrated arrangement, X1 and X2 will be inverted with respect to XIN, while XB will be non-inverted with respect to XIN.

As a result, when XIN is low in a steady state, X1 and X2 will be high and XB will be low. In this steady state, with X1 and X2 high, transistors 414 and 424 will be turned on, pulling node X down and bringing BOUTX to a low state. With XB low, transistors 412 and 422 will be turned off, pulling node Y up and bringing BOUTY to a high state. Conversely, when XIN is in a high steady state, X1 and X2 are low while XB is high. As a result, transistors 414 and 424 are turned off (pulling node X up) while transistors 412 and 422 are turned on (pulling node Y down), bringing BOUTX to a high state and BOUTY to a low state.

When XIN transitions, X1, XB, and X2 will also transition, in sequence, due to the inverters 432–436. The physical dimensions of the inverters 432–436 may be chosen in an effort to ensure the switching point of signal XB falls at approximately midway between the switching points of signals X1 and X2. For some embodiments, this may be accomplished by using inverters 432–436 having substantially the same dimensions. A fourth inverter 438 may be used to ensure the signal X2 sees a substantially identical load as the signals X1 and XB. For some embodiments, XIN may be used to switch transistor 414 directly. However, using the output of an inverter (e.g., output X1 of inverter 432) may ensure the switching characteristics of each waveform are identical.

By coupling the drains of transistors 414 and 424 together, the common node X becomes a summing node for currents IX1 and IX2. By carefully controlling the transition times of the signals X1 and X2 used to switch transistors 414 and 424, the average of these currents may be substantially equal to the average of currents IY1 and IY2 flowing through the transistors 412 and 422. In other words, the branches of the summing node X effectively convert the switching times of signals X1 and X2 into currents IX1 and IX2, respectively. As a result, while transistor 414 begins to turn off/on before transistors 412 and 422 (due to the earlier transition of signal X1 relative to XB) and transistor 424 begins to turn off/on after transistors 412 and 422 (due to the later transition of signal X2 relative to XB), the differential signals generated on nodes X and Y will transition substantially simultaneously.

This result may be described with reference to FIG. 5, which illustrates an exemplary timing diagram for the signals depicted in FIG. 4. Waveforms for signals XIN, XB, and X2 are shown as waveforms 502, 504, and 506, respectively. Waveforms for the differential output signals BOUTX and BOUTY are shown as waveforms 514 and 512, respectively. The illustrated example assumes that the input signal XIN begins in an initial low state. Consequently, X1 and X2 begin in a high state and XB begins in a low state, causing node X to be pulled down, keeping differential signal BOUTX in a low initial state, while node Y is pulled up, keeping differential signal BOUTY in a high initial state.

XIN then transitions to a high state, causing X1 to begin transitioning to a low state, at a time t0. Once X1 falls below a switching threshold of transistor 414, at time t1, transistor 414 will turn off. At this point, because X2 is still high, transistor 424 will remain turned on, allowing current (IX2) to flow. In other words, transistors 414 and 424 will be in contention, limiting the rate at which node X is pulled up.

Due to the delay associated with the inverter 434, XB will not begin transitioning to a high state until a time t2 after X1 has begun transitioning. As a result, XB will not reach a switching threshold of transistors 412 and 422, until a later time t3, finally causing these transistors to turn on and node Y to begin discharging, transitioning BOUTY to a low state.

Due to the delay associated with the inverter 436, X2 will not begin transitioning to a low state until a period after XB has begun transitioning. As a result, X2 will not fall below the switching threshold of transistors 424, until a later time t4, finally causing transistor 424 to turn off and allowing node X to begin discharging through both transistor 414 and 424.

Figure 1:
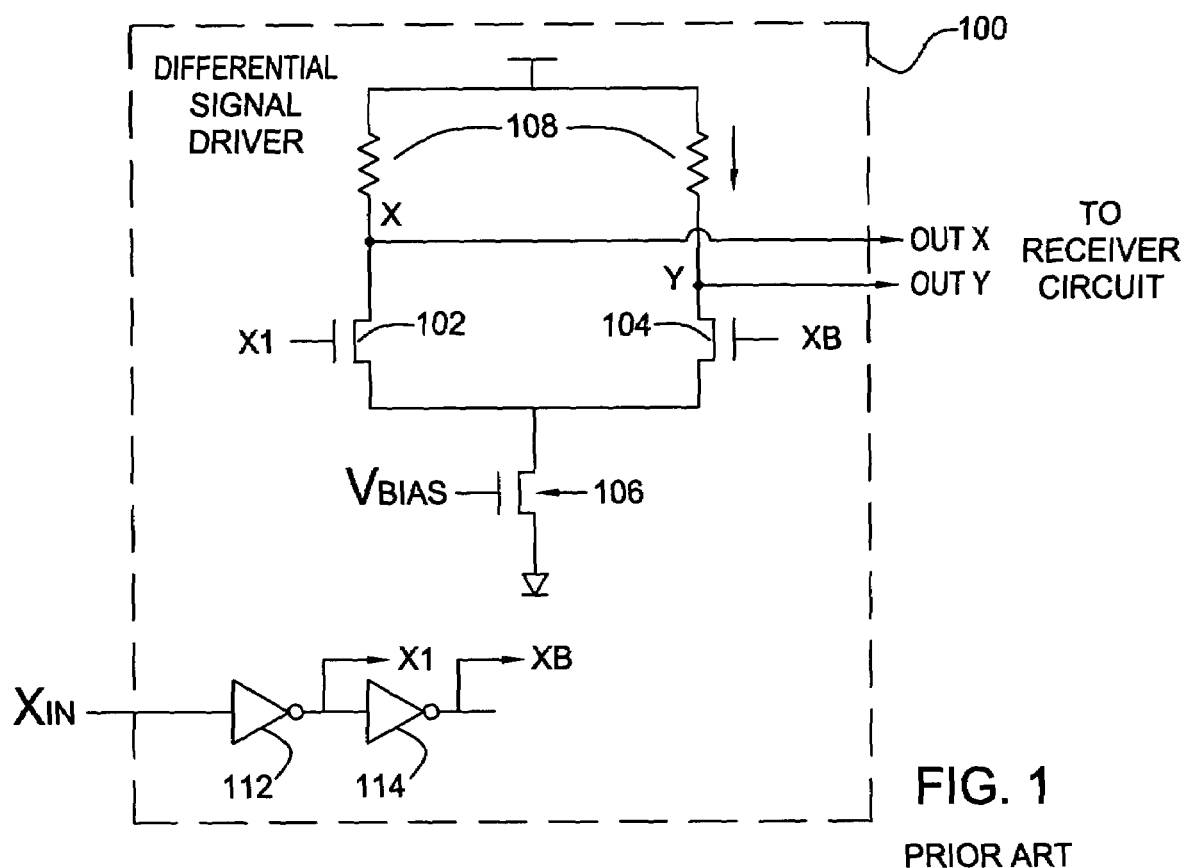
FIG. 1 illustrates a schematic diagram of an exemplary differential signal driver circuit in accordance with the prior art.
Figure 2:
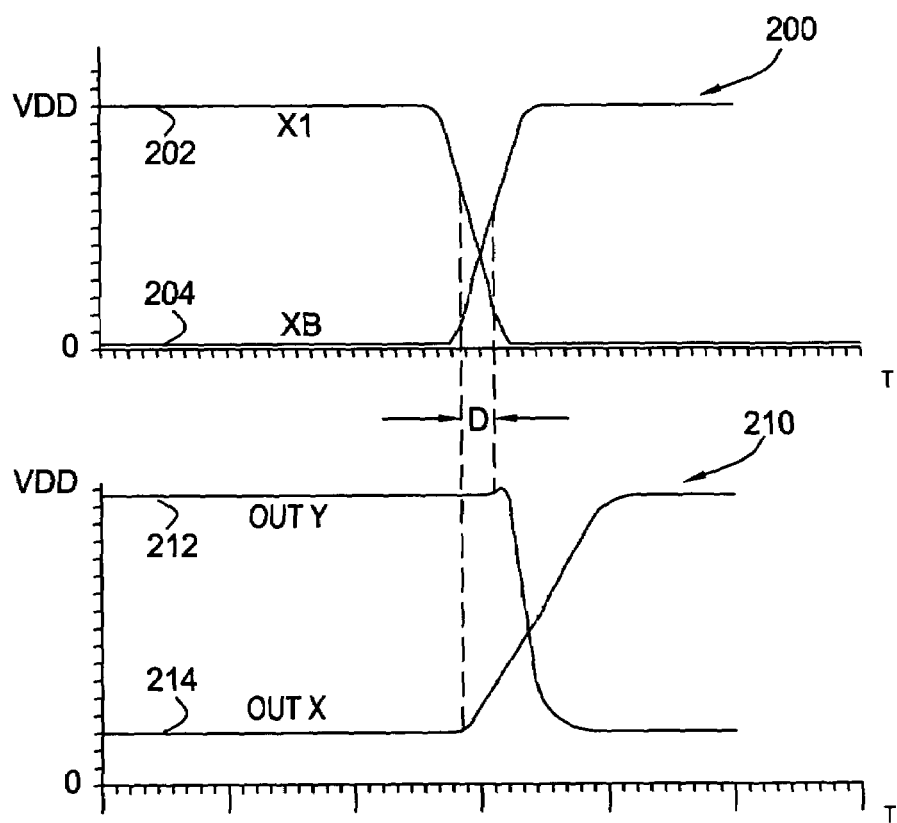
FIG. 2 illustrates an exemplary timing diagram for signals illustrated in FIG. 1.
Figure 5:
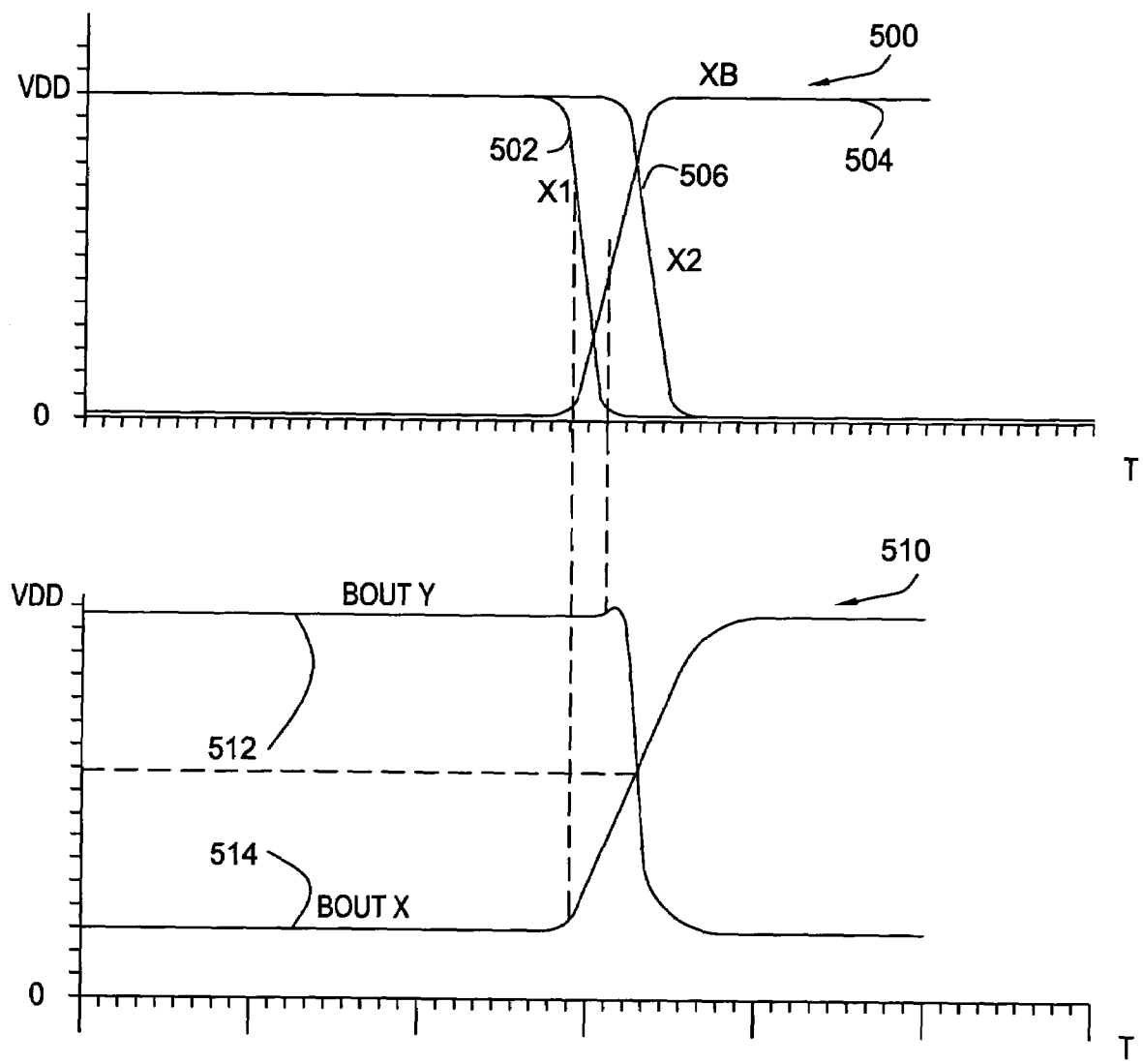
FIG. 5 illustrates an exemplary timing diagram for signals illustrated in FIG. 4.

As illustrated in FIG. 5, by controlling the switching times of X1 (faster) and X2 (slower) to effectively average to be the same as that of XB. As a result, the differential signals BOUTX and BOUTY may be switched substantially simultaneously, with transition points that cross at a midpoint. Therefore, duty cycle distortion may be significantly reduced, particularly when compared to that of differential signals OUTX and OUTY shown in FIG. 2.

Those skilled in the art will recognize that various other types of delay stages, such as non-inverting delay stages, may also be used to generate control signals, provided corresponding changes are made to the first and second stages (e.g., utilizing both NMOS and PMOS switching transistors in each stage). Further, while only two stages were illustrated, for some embodiments more than two stages may be used to average the switching times of more than two control signals.

CONCLUSION

By providing a balanced differential driver circuit, with substantially identical symmetrical stages, a pair of differential signals with balanced switching characteristics may be generated from a single ended signal. As a result, duty cycle distortion may be significantly reduced and a receiver circuit receiving these differential signals may be able to generate a single ended signal with substantially symmetrical low and high states, which may lead to improved timing margins.

While the foregoing is directed to embodiments of the present invention, other and further embodiments of the invention may be devised without departing from the basic scope thereof, and the scope thereof is determined by the claims that follow.

What is claimed is:

1. A differential driver circuit, comprising:
   a control signal generator for generating at least first, second and third of control signals based on a single ended input signal, wherein, in response to a transition of the single ended input signal from a first state to a second state, the second control signal begins to transition at a point in time between the beginnings of transitions of the first and third signal; and first and second stages responsive to the first, second, and third control signals to generate a pair of differential signals on common nodes, each coupled to both the first and second stages.

2. The differential driver circuit of claim 1, wherein the first and second stages comprise substantially identical circuit components.

3. The differential driver circuit of claim 1, the control signal generator is configured to generate the first and third control signals as logical inversions of the single ended input signal and the second control signal.

4. The differential driver circuit of claim 3, wherein the control signal generator comprises a series of substantially identical inverters, each generating a different one of the control signals.

5. The differential driver circuit of claim 1, wherein:
switching of components in the first stage is controlled by the first and second control signals; and
switching of components in the second stage is controlled by the second and third control signals.

6. The differential driver circuit of claim 5, wherein:
first and second transistors in the first stage are responsive to the first and second control signals, respectively; and
first and second transistors in the second stage are responsive to the third and second control signals, respectively.

7. The differential driver circuit of claim 6, wherein a first one of the pair of complementary signals is formed at a common node coupled to drains of the first transistors of the first and second stages.

8. The differential driver circuit of claim 7, wherein a second one of the pair of complementary signals is formed at a common node coupled to drains of the second transistors of the first and second stages.

9. The differential driver circuit of claim 1, wherein the first and second stages are responsive to the first, second, and third control signals such that the pair of differential signals transition, in opposite directions, substantially simultaneously.

10. A differential driver circuit, comprising:
a series of inverters for generating at least first, second, and third control signals based on a single ended input signal, wherein the first and third control signals are logically inverted relative to the single ended input signal;
a first stage comprising first and second transistors controlled by the first and second control signals, respectively;
a second stage comprising first and second transistors controlled by the third and second control signals, respectively;
a first output node electrically coupled to drains of the first transistors of the first and second stages for generating a first of a pair of differential signals; and
a second output node electrically coupled to drains of the second transistors of the first and second stages for generating a second of the pair of differential signals.

11. The differential driver circuit of claim 10, wherein the first and third control signals are logically inverted relative to the single ended input signal and the second control signal.

12. The differential driver circuit of claim 10, wherein the series of inverters comprises a series of substantially identical inverters.

13. The differential driver circuit of claim 12, wherein the series of inverters is configured such that a transition of the second control signal occurs at a point substantially equal to a midpoint between transitions of the first and third control signals.

14. A method of generating a pair of differential signals from a single ended input signal, comprising:
generating at least first, second, and third control signals based on the single ended input signal, wherein, in response to a transition of the single ended input signal from a first state to a second state, the second control signal begins to transition at a point in time between the beginnings of transitions of the first and third control signal; and
controlling the switching of first and second stages with the first, second, and third control signals to generate a pair of differential signals on common nodes, each coupled to both the first and second stages.

15. The method of claim 14, wherein the first and second stages comprise substantially identical circuit components.

16. The method of claim 14, wherein generating the at least first, second, and third control signals comprises generating the first and third control signals that are logically inverted relative to the single ended input signal and the second control signal.

17. The method of claim 16, wherein generating the at least first, second, and third control signals comprises applying the single ended input signal to a series of substantially identical inverters.

18. The method of claim 14, wherein controlling the switching of the first and second stages with the first, second, and third control signals comprises:
switching first and second transistors in the first stage with the first and second control signals, respectively; and
switching first and second transistors in the second stage with the third and second control signals, respectively.

19. The method of claim 18, wherein a first one of the pair of complementary signals is formed at a common node coupled to drains of the first transistors of the first and second stages.

20. The method of claim 19, wherein a second one of the pair of complementary signals is formed at a common node coupled to drains of the second transistors of the first and second stages.

* * * * *